United States Patent
Cui et al.

(10) Patent No.: US 11,888,417 B2
(45) Date of Patent: Jan. 30, 2024

(54) ENERGY CONVERSION APPARATUS, MOTOR, POWER SYSTEM, AND VEHICLE

(71) Applicant: Huawei Digital Power Technologies Co., Ltd., Shenzhen (CN)

(72) Inventors: Zhaoxue Cui, Dongguan (CN); Wei Zhang, Dongguan (CN); Ningbo Feng, Xi'an (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 132 days.

(21) Appl. No.: 17/710,726

(22) Filed: Mar. 31, 2022

(65) Prior Publication Data
US 2022/0224271 A1 Jul. 14, 2022

(30) Foreign Application Priority Data

Mar. 31, 2021 (CN) .......................... 202110354753.2

(51) Int. Cl.
*H02P 27/04* (2016.01)
*H02P 27/06* (2006.01)
*H03K 3/037* (2006.01)

(52) U.S. Cl.
CPC .............. *H02P 27/06* (2013.01); *H03K 3/037* (2013.01)

(58) Field of Classification Search
CPC .............................. H02P 27/06; H02J 2310/48
See application file for complete search history.

(56) References Cited

U.S. PATENT DOCUMENTS

| | | | | |
|---|---|---|---|---|
| 2014/0197768 A1* | 7/2014 | Haugen | ................... | H02P 27/04 318/442 |
| 2015/0288271 A1* | 10/2015 | Kuznetsov | .............. | H02P 25/22 310/55 |
| 2019/0275905 A1 | 9/2019 | Ruppert | | |

FOREIGN PATENT DOCUMENTS

| | | |
|---|---|---|
| CN | 109167423 A | 1/2019 |
| CN | 111434513 A | 7/2020 |
| CN | 111434514 A | 7/2020 |
| WO | 2020149944 A1 | 7/2020 |

(Continued)

OTHER PUBLICATIONS

Metwly et al., "A Review of Integrated On-Board EV Battery Chargers: Advanced Topologies, Recent Developments and Optimal Selection of FSCW Slot/Pole Combination," Digital Object Identifier 10.1109/ACCESS.2020.2992741, Total 27 pages (Date of current version May 19, 2020).

(Continued)

*Primary Examiner* — Muhammad S Islam
(74) *Attorney, Agent, or Firm* — Leydig, Voit & Mayer, Ltd.

(57) ABSTRACT

An energy conversion apparatus, a motor, a power system, and a vehicle are provided. The energy conversion apparatus may integrate a motor drive function by using a three-phase bridge arm converter and a motor winding, and integrate an alternating current charging function by using a two-phase two-bridge-arm converter and a transformer. In this way, the energy conversion apparatus can integrate the charging function and the motor drive function. When the energy conversion apparatus is installed on an electric vehicle, a vehicle integration level can be increased, a structure layout of the electric vehicle can be simplified, and costs and a volume of the electric vehicle can be reduced.

10 Claims, 5 Drawing Sheets

(56) References Cited

FOREIGN PATENT DOCUMENTS

WO 2021027648 A1 2/2021

OTHER PUBLICATIONS

Housheng, "Research on Key Control Techniques of Integrated Driving and Charging System of Electric Vehicle," Dissertation Submitted to Hebei University of Technology for The Doctor Degree of Control Theory and Control Engineering, Total 206 pages (Dec. 2016). With an English abstract.

* cited by examiner

ENERGY CONVERSION APPARATUS, MOTOR, POWER SYSTEM, AND VEHICLE

CROSS-REFERENCE TO RELATED APPLICATIONS

This application claims priority to Chinese Patent Application No. 202110354753.2, filed on Mar. 31, 2021, which is hereby incorporated by reference in its entirety.

TECHNICAL FIELD

Embodiments of this application relate to the field of energy technologies, and in particular, to an energy conversion apparatus, a motor, a power system, and a vehicle.

BACKGROUND

In the field of energy technologies, a charging technology for electric vehicles is always an important research direction of researchers. In addition to a charger and a battery that are related to charging, a plurality of motors are further mounted on the electric vehicle, for example, a motor that drives the vehicle to travel and a motor in an air conditioner compressor. These functional components on the electric vehicle are all separately distributed, resulting in a complex structure layout, a low integration level, a large volume, and high costs of the electric vehicle.

To increase the vehicle integration level, simplify the structure layout of the electric vehicle, and reduce the costs and volume of the electric vehicle, it is necessary to integrate a charging function and a motor drive function of the electric vehicle.

SUMMARY

Embodiments of this application provide an energy conversion apparatus, a motor, a power system, and a vehicle. The apparatus integrates a charging function and a motor drive function. When the apparatus is installed on an electric vehicle, a vehicle integration level can be increased, a structure layout of the electric vehicle can be simplified, and costs and a volume of the electric vehicle can be reduced.

According to a first aspect, an embodiment of this application provides an energy conversion apparatus, including a three-phase bridge arm converter, a motor winding, a two-phase two-bridge-arm converter, and a transformer. A direct current port of the three-phase bridge arm converter is connected to a battery; an alternating current port of the three-phase bridge arm converter is connected to the motor winding; a direct current port of the two-phase two-bridge-arm converter is connected to the battery; an alternating current port of the two-phase two-bridge-arm converter is connected to a secondary-side winding of the transformer; and a primary-side winding of the transformer is connected to an alternating current charging port.

The energy conversion apparatus provided in the first aspect of this application may integrate a motor drive function by using the three-phase bridge arm converter and the motor winding, and integrate an alternating current charging function by using the two-phase two-bridge-arm converter and the transformer. In this way, the energy conversion apparatus can integrate the charging function and the motor drive function. When the energy conversion apparatus is installed on an electric vehicle, a vehicle integration level can be increased, a structure layout of the electric vehicle can be simplified, and costs and a volume of the electric vehicle can be reduced.

According to a second aspect, an embodiment of this application provides an energy conversion apparatus, including a three-phase bridge arm converter, a motor winding, and a transformer. A direct current port of the three-phase bridge arm converter is connected to a battery; an alternating current port of the three-phase bridge arm converter is connected to the motor winding; two bridge arms of the three-phase bridge arm converter are connected to a secondary-side winding of the transformer through a first switch group, and the first switch group is configured to control connection and disconnection between the transformer and the two bridge arms of the three-phase bridge arm converter; a second switch group is further disposed between the motor winding and the two bridge arms of the three-phase bridge arm converter, and the second switch group is configured to control connection and disconnection between the motor winding and the two bridge arms of the three-phase bridge arm converter; and a primary-side winding of the transformer is connected to an alternating current charging port.

The energy conversion apparatus provided in the second aspect of this application may integrate a motor drive function by using the three-phase bridge arm converter and the motor winding, implement an alternating current charging function by reusing the two bridge arms of the three-phase bridge arm converter, and implement conversion between a motor drive mode and an alternating current charging mode by using the first switch group and the second switch group. Therefore, the energy conversion apparatus can not only integrate the charging function and the motor drive function, but also reuse some circuits. This further increases an integration level and reduces a volume.

With reference to the second aspect, in an implementation provided in this embodiment of this application, the first switch group and the second switch group include a flip-flop K1 and a flip-flop K2; one end of the flip-flop K1 is connected to an alternating current port of a first bridge arm of a two-phase two-bridge-arm converter, and the other end of the flip-flop K1 includes two contacts respectively connected to the motor winding and a secondary-side winding of the transformer; and one end of the flip-flop K2 is connected to an alternating current port of a second bridge arm of the two-phase two-bridge-arm converter, and the other end of the flip-flop K2 includes two contacts respectively connected to the motor winding and the secondary-side winding of the transformer. In this implementation, functions of the first switch group and the second switch group are implemented by using two flip-flops. This further increases an integration level and reduces a volume.

According to a third aspect, an embodiment of this application provides an energy conversion apparatus, including a three-phase bridge arm converter, a motor winding, a bridge arm circuit, and a transformer. A direct current port of the three-phase bridge arm converter is connected to a battery; an alternating current port of the three-phase bridge arm converter is connected to the motor winding; an alternating current port of one bridge arm of the three-phase bridge arm converter is further connected to a secondary-side winding of the transformer; a direct current port of the bridge arm circuit is connected to the battery; an alternating current port of the bridge arm circuit is connected to the secondary-side winding of the transformer; and a primary-side winding of the transformer is connected to an alternating current charging port.

The energy conversion apparatus provided in the third aspect of this application may integrate a motor drive function by using the three-phase bridge arm converter and the motor winding, and implement an alternating current charging function by using the bridge arm circuit and reusing the bridge arm of the three-phase bridge arm converter. Therefore, the energy conversion apparatus can not only integrate the charging function and the motor drive function, but also reuse some circuits. This further increases an integration level and reduces a volume.

With reference to the third aspect, in an implementation of this embodiment of this application, the bridge arm circuit is two capacitors connected in series, two diodes connected in series, or two switching transistors connected in series. This implementation provides a plurality of implementation solutions, so that the solutions provided in embodiments of this application are more comprehensive.

According to a fourth aspect, an embodiment of this application provides an energy conversion apparatus, including a three-phase bridge arm converter, a motor winding, and a transformer. A direct current port of the three-phase bridge arm converter is connected to a battery; an alternating current port of the three-phase bridge arm converter is connected to the motor winding; an alternating current port of one bridge arm of the three-phase bridge arm converter is specifically connected to the motor winding through a first switch and connected to one end of a secondary-side winding of the transformer through a second switch; the other end of the secondary-side winding of the transformer is connected to a busbar end of the motor winding through a third switch; and a primary-side winding of the transformer is connected to an alternating current charging port.

The energy conversion apparatus provided in the fourth aspect of this application may integrate a motor drive function by using the three-phase bridge arm converter and the motor winding, and implement an alternating current charging function by reusing three bridge arms of the three-phase bridge arm converter as a converter. Therefore, the energy conversion apparatus can not only integrate the charging function and the motor drive function, but also reuse some circuits. This further increases an integration level and reduces a volume.

With reference to the fourth aspect, in an implementation of this embodiment of this application, the first switch and the second switch are specifically a flip-flop K3; and one end of the flip-flop K3 is connected to the alternating current port of the bridge arm of the three-phase bridge arm converter, and the other end of the flip-flop K3 includes two contacts respectively connected to one winding in the motor winding and the end of the secondary-side winding of the transformer. In this implementation, functions of the first switch and the second switch are implemented by using one flip-flop. This further increases an integration level and reduces a volume.

According to a fifth aspect, an embodiment of this application provides an energy conversion apparatus, including a three-phase bridge arm converter, a motor winding, a bridge arm circuit, and a transformer. A direct current port of the three-phase bridge arm converter is connected to a battery; an alternating current port of the three-phase bridge arm converter is connected to the motor winding; a direct current port of the bridge arm circuit is connected to the battery, and an alternating current port of the bridge arm circuit is connected to one end of a secondary-side winding of the transformer; the other end of the secondary-side winding of the transformer is connected to a busbar end of the motor winding through a third switch; and a primary-side winding of the transformer is connected to an alternating current charging port.

The energy conversion apparatus provided in the fifth aspect of this application may integrate a motor drive function by using the three-phase bridge arm converter and the motor winding, and implement an alternating current charging function by using the bridge arm circuit and reusing the three-phase bridge arm converter and the motor winding. Therefore, the energy conversion apparatus can not only integrate the charging function and the motor drive function, but also reuse some circuits. This further increases an integration level and reduces a volume.

With reference to the first aspect, the second aspect, the third aspect, the fourth aspect, or the fifth aspect, in an implementation of embodiments of this application, a fourth switch is disposed between the primary-side winding of the transformer and the alternating current charging port, and is configured to control connection and disconnection between the primary-side winding of the transformer and the alternating current charging port. In this implementation, the connection and disconnection between the primary-side winding of the transformer and the alternating current charging port are controlled by using the fourth switch, so that the solutions provided in embodiments of this application are more comprehensive.

With reference to the first aspect, the second aspect, the third aspect, the fourth aspect, or the fifth aspect, in an implementation of embodiments of this application, an alternating current filter is disposed between the primary-side winding of the transformer and the alternating current charging port. In this implementation, an alternating current that is input from the alternating current charging port is filtered by using the alternating current filter, so that the solutions provided in embodiments of this application are more comprehensive.

With reference to the first aspect, the second aspect, the third aspect, the fourth aspect, or the fifth aspect, in an implementation of embodiments of this application, the transformer is specifically a power frequency transformer. In this implementation, the power frequency transformer is used as the transformer, so that the solutions provided in embodiments of this application are more comprehensive.

According to a sixth aspect, an embodiment of this application provides a motor. The motor includes a housing, and the energy conversion apparatus according to the first aspect, the second aspect, the third aspect, the fourth aspect, or the fifth aspect is accommodated in the housing.

According to a seventh aspect, an embodiment of this application provides a power system, including a motor and the energy conversion apparatus according to the first aspect, the second aspect, the third aspect, the fourth aspect, or the fifth aspect. A motor winding of the energy conversion apparatus is configured to drive the motor.

According to an eighth aspect, an embodiment of this application provides a vehicle, including the energy conversion apparatus according to the first aspect, the second aspect, the third aspect, the fourth aspect, or the fifth aspect, the motor according to the sixth aspect, or the power system according to the seventh aspect.

DESCRIPTION OF EMBODIMENTS

Embodiments of this application provide an energy conversion apparatus, a motor, a power system, and a vehicle. The apparatus integrates a charging function and a motor drive function. When the apparatus is installed on an electric vehicle, a vehicle integration level can be increased, a structure layout of the electric vehicle can be simplified, and costs and a volume of the electric vehicle can be reduced.

In the specification, claims, and accompanying drawings of this application, the terms "first", "second", "third", "fourth", and the like (if existent) are intended to distinguish between similar objects but do not necessarily indicate a specific order or sequence. It should be understood that the data termed in such a way are interchangeable in proper circumstances, so that embodiments described herein can be implemented in an order other than the order illustrated or described herein. Moreover, the terms "include", "correspond to" and any other variants mean to cover the non-exclusive inclusion, for example, a process, method, system, product, or device that includes a list of steps or units is not necessarily limited to those expressly listed steps or units, but may include other steps or units not expressly listed or inherent to such a process, method, system, product, or device.

In embodiments of this application, words such as "example" or "for example" are used to indicate examples, instances, or descriptions. Any embodiment or solution described as "example" or "for example" in embodiments of this application is not to be construed as being more preferred or advantageous than other embodiments or solutions. Exactly, use of the word "example" or "for example" or the like is intended to present a relative concept in a specific manner.

For clear and brief description of the following embodiments, a related technology is briefly described first.

There are usually two types of solutions for integration of a charging function and a motor drive function of an electric vehicle. One type of solution is a non-isolated-type integrated charging solution, and non-isolated-type charging means that no transformer is used for isolation between a charging port and a high-voltage battery. To be specific, in this charging solution, the high-voltage battery and the charging port have a direct electrical connection relationship. Consequently, there is a safety risk. At present, this non-isolated-type charging solution is basically not used on the electric vehicle.

The other type of solution is an isolated-type integrated charging solution. To be specific, at least one transformer is used for isolation on a transformer circuit between a charging port and a high-voltage battery. After input from an alternating current port, rectification is performed and then a voltage is boosted. Subsequently, a next converter performs isolated conversion to charge the high-voltage battery. In this isolated-type charging solution, both a separate charging solution and an integrated charging solution are main forms of electric vehicle charging at present.

However, in a current solution, an integration level is relatively low, costs are relatively high, and a volume is relatively large. An embodiment of this application provides an energy conversion apparatus. The apparatus integrates a charging function and a motor drive function. When the apparatus is installed on an electric vehicle, a vehicle integration level can be increased, a structure layout of the electric vehicle can be simplified, and costs and a volume of the electric vehicle can be reduced.

Figure 1:
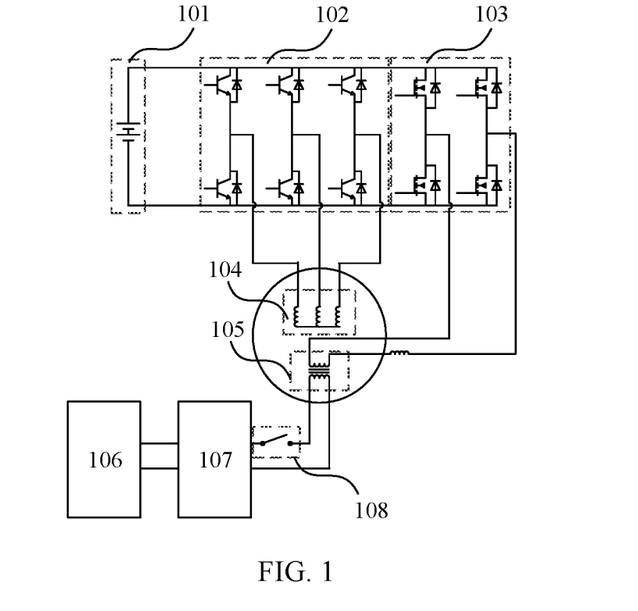
FIG. 1 is a schematic diagram of an energy conversion apparatus according to an embodiment of this application.

FIG. 1 is a schematic diagram of an energy conversion apparatus according to an embodiment of this application. The energy conversion apparatus integrates a charging function and a motor drive function. The energy conversion apparatus includes a three-phase bridge arm converter 102, a motor winding 104, a two-phase two-bridge-arm converter 103, and a transformer 105. A direct current port of the three-phase bridge arm converter 102 is connected to a battery 101, an alternating current port of the three-phase bridge arm converter 102 is connected to the motor winding 104, a primary-side winding of the transformer 105 is connected to an alternating current charging port 106, a secondary-side winding of the transformer 105 is connected to an alternating current port of the two-phase two-bridge-arm converter 103, and a direct current port of the two-phase two-bridge-arm converter 103 is connected to the direct current port of the three-phase bridge arm converter 102. The following describes components of the energy conversion apparatus in detail.

1. Battery 101

In this embodiment of this application, two ends of the battery 101 each may be used as an output port or an input port.

In this embodiment of this application, the battery 101 may be specifically a high-voltage battery. With development of electric vehicle technologies, a requirement for long endurance is increasingly high. Therefore, a higher requirement is imposed on a battery capacity, and a battery voltage is also increasingly high. Therefore, high-voltage batteries are used for more electric vehicles to provide energy for traveling of the vehicles. The battery 101 in this embodiment of this application may be a high-voltage battery, and is applicable to an electric vehicle with a higher requirement.

2. Three-Phase Bridge Arm Converter 102

In this embodiment of this application, the three-phase bridge arm converter 102 may be specifically a three-phase three-bridge-arm converter, a three-phase four-bridge-arm converter, or the like. This is not limited in this embodiment of this application. For example, when the three-phase bridge arm converter 102 is a three-phase three-bridge-arm converter, the three-phase bridge arm converter 102 includes three bridge arms, and each bridge arm may be two switching transistors connected in series. A port for connecting the three bridge arms in parallel is the direct current port of the three-phase bridge arm converter 102, and is configured to connect to a direct current device. In this embodiment of this application, the direct current port of the three-phase bridge arm converter 102 is connected to the battery 101. Intermediate end points of the three bridge arms are three alternating current ports of the three-phase bridge arm converter 102, and are configured to connect to the motor winding 104. When an alternating current passes through the motor winding 104, a corresponding motor is driven.

In some embodiments, a switching transistor used for the three-phase bridge arm converter 102 may be a transistor connected to a diode in parallel, a metal-oxide-semiconductor field-effect transistor (MOSFET), an insulated gate bipolar transistor (IGBT), or the like. This is not limited in embodiments of this application.

3. Two-Phase Two-Bridge-Arm Converter 103

In this embodiment of this application, the two-phase two-bridge-arm converter 103 may include two bridge arms, and each bridge arm may include two switching transistors connected in series. A parallel connection end of the two bridge arms is the direct current port of the two-phase two-bridge-arm converter 103. The direct current port of the two-phase two-bridge-arm converter 103 may be connected to the battery 101. Intermediate end points of the two bridge arms are two alternating current ports of the two-phase two-bridge-arm converter 103. The two alternating current ports of the two-phase two-bridge-arm converter 103 are connected to two ends of the secondary-side winding of the transformer 105.

In some embodiments, a power factor correction (PFC) inductor is further connected in series between one alternating current port of the two-phase two-bridge-arm converter 103 and the secondary-side winding of the transformer 105, and is configured to cooperate with the two-phase two-bridge-arm converter 103 to implement a boost function.

In this embodiment of this application, a switching transistor used for the two-phase two-bridge-arm converter 103 may be a transistor connected to a freewheeling diode in parallel, an MOS transistor, an IGBT, or the like. This is not limited in this embodiment of this application. A type of the switching transistor used for the two-phase two-bridge-arm converter 103 may be the same as or different from a type of the switching transistor used for the three-phase bridge arm converter 102. This is not limited in this embodiment of this application.

4. Motor Winding 104

In this embodiment of this application, the motor winding 104 is a winding of a motor on an electric vehicle. Specifically, the motor winding 104 may be a stator winding.

The motor in this embodiment of this application may be a motor that drives the vehicle to travel on the electric vehicle, or may be a motor in a compressor used by an air conditioner on the electric vehicle. Certainly, another similar motor is also included in the motor in this embodiment of this application. A type of the motor is not limited in this embodiment of this application. Actually, because a power of the air conditioner compressor is equivalent to that of an alternating current charger of the electric vehicle, higher utilization can be achieved by integrating the charger and the compressor.

5. Transformer 105

In this embodiment of this application, the transformer 105 may be a power frequency transformer, and is configured to isolate the alternating current charging port 106 from the battery 101, so that the alternating current charging port 106 and the battery 101 are not directly electrically connected. This is safer.

In this embodiment of this application, the two ends of the secondary-side winding of the transformer 105 are connected to the two alternating current ports of the two-phase two-bridge-arm converter 103, and the primary-side winding of the transformer 105 is connected to the alternating current charging port 106, to isolate an alternating current that is input from the alternating current charging port 106 and then transmit the alternating current to the two-phase two-bridge-arm converter 103. Then, the two-phase two-bridge-arm converter 103 may convert the alternating current into a direct current and transmit the direct current to the battery 101, to charge the battery 101.

Figure 2:
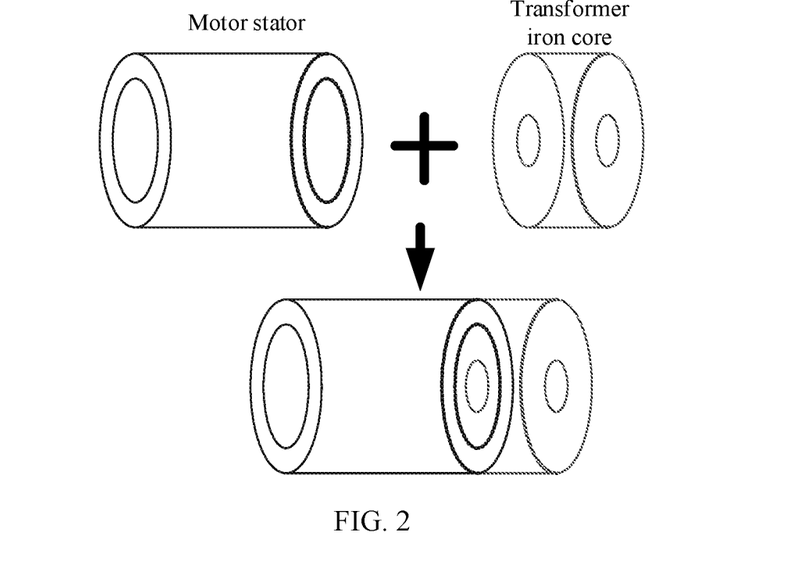
FIG. 2 is a schematic diagram of an integration manner according to an embodiment of this application.

In this embodiment of this application, mutual interference between a winding of the transformer 105 and a winding of the motor winding 104 should be avoided as much as possible. However, in some embodiments, the transformer 105 and the motor winding 104 are integrated into one motor together, and are relatively close to each other. Therefore, an embodiment of this application provides an integration manner, as shown in FIG. 2, to avoid mutual interference between the winding of the transformer 105 and the winding of the motor winding 104. FIG. 2 is a schematic diagram of an integration manner according to an embodiment of this application. A motor stator corresponding to the motor winding 104 is disposed coaxially with a transformer iron core corresponding to the transformer 105 in an aligned manner. The motor winding is wound on the motor stator, and the primary-side winding and the secondary-side winding of the transformer 105 are wound on the transformer iron core. In this case, interference between the winding of the transformer 105 and the winding of the motor winding 104 is relatively weak.

In some embodiments, an alternating current filter 107 is disposed between the primary-side winding of the transformer 105 and the alternating current charging port 106, and is configured to perform filtering on an alternating current that is input from the alternating current charging port 106. The alternating current filter 107 is similar to a conventional alternating current filter device. Details are not described herein.

In some embodiments, a switch 108 is disposed between the primary-side winding of the transformer 105 and the alternating current charging port 106 to implement connection or disconnection between the energy conversion apparatus and the alternating current charging port 106. As shown in FIG. 1, the switch 108 may be disposed between one end of the primary-side winding of the transformer 105 and one port of the alternating current charging port 106. It may be understood that both the alternating current filter 107 and the switch 108 may be disposed between the primary-side winding of the transformer 105 and the alternating current charging port 106.

6. Alternating Current Charging Port 106

In this embodiment of this application, the alternating current charging port 106 is configured to connect to a power grid or connect to an alternating current charging pile. For example, after the alternating current charging port 106 is connected to the alternating current charging pile, electric energy in the alternating current charging pile may be input to the energy conversion apparatus through the alternating current charging port 106, to charge the battery 101.

It may be understood that the alternating current charging port 106 may be in a shape of a standard charging port, or may be in a form of a fast charging port. In addition, a protocol supported by the alternating current charging port 106 may be a standard charging protocol or a fast charging protocol of electric vehicles. In this embodiment of this application, a shape, a size, a supported protocol, and the like of the alternating current charging port 106 are not limited.

In this embodiment of this application, the alternating current filter 107 may be disposed between the alternating current charging port 106 and the transformer 105. The alternating current filter 107 is similar to another alternating current filter device. Details are not described herein.

In this embodiment of this application, the switch 108 may be disposed between the alternating current charging port 106 and the transformer 105, to control connection and disconnection between the alternating current charging port 106 and the transformer 105.

In this embodiment of this application, both the alternating current filter 107 and the switch 108 may be disposed. This is not limited in this embodiment of this application.

Figure 3A:
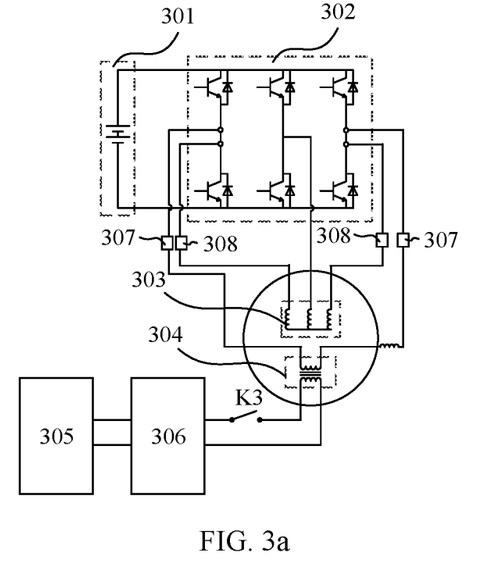
FIG. 3a is a schematic diagram of another energy conversion apparatus according to an embodiment of this application.

FIG. 3a is a schematic diagram of another energy conversion apparatus according to an embodiment of this application. The energy conversion apparatus includes a battery 301, a three-phase bridge arm converter 302, a motor winding 303, a transformer 304, and an alternating current charging port 305. A direct current port of the three-phase bridge arm converter 302 is connected to the battery 301, an alternating current port of the three-phase bridge arm converter 302 is connected to the motor winding 303, a primary-side winding of the transformer 304 is connected to the alternating current charging port 305, and a secondary-side winding of the transformer 304 is connected to two bridge arms of the three-phase bridge arm converter 302. The following describes components of the energy conversion apparatus in detail.

In this embodiment of this application, the battery 301 is similar to the battery 101 in the foregoing embodiments corresponding to FIG. 1, and details are not described herein again.

In this embodiment of this application, the three-phase bridge arm converter 302 may be specifically a three-phase three-bridge-arm converter, a three-phase four-bridge-arm converter, or the like. This is not limited in this embodiment of this application. For example, when the three-phase bridge arm converter 302 is a three-phase three-bridge-arm converter, the three-phase bridge arm converter 302 includes three bridge arms, and each bridge arm may be two switching transistors connected in series. A port for connecting the three bridge arms in parallel is the direct current port of the three-phase bridge arm converter 302, and is configured to connect to a direct current device. In this embodiment of this application, the direct current port of the three-phase bridge arm converter 302 is connected to the battery 301. Intermediate end points of the three bridge arms are three alternating current ports of the three-phase bridge arm converter 302, and are configured to connect to the motor winding 303. When an alternating current passes through the motor winding 303, a corresponding motor is driven.

In some embodiments, a switching transistor used for the three-phase bridge arm converter 302 may be a transistor connected to a diode in parallel, a metal-oxide-semiconductor field-effect transistor (MOSFET), an IGBT, or the like. This is not limited in embodiments of this application.

In addition, in this embodiment of this application, the two bridge arms of the three-phase bridge arm converter 302 may further be used as two bridge arms of an inverter, that is, the two bridge arms of the three-phase bridge arm converter 302 may be connected to the secondary-side winding of the transformer 304, to invert a direct current at the direct current port to an alternating current and transmit the alternating current to the transformer 304. Therefore, the three-phase bridge arm converter 302 in this embodiment of this application has two functions: One is to serve as a three-phase inverter by using the three bridge arms to provide electric energy for the motor winding 303, and the other is to serve as a two-phase inverter to deliver electric energy to the transformer 304. In actual application, the three-phase bridge arm converter 302 may provide optionality for the foregoing two functions by using two switch groups (a first switch group 307 and a second switch group 308). As shown in FIG. 3a, the two bridge arms of the three-phase bridge arm converter 302 may be connected to the secondary-side winding of the transformer 304 through the first switch group 307, and connected to the motor winding 303 (which may be specifically two windings of the motor winding 303) through the second switch group 308.

In the embodiment of FIG. 3a, when the energy conversion apparatus is in an alternating current charging mode, the first switch group 307 may be connected, and the second switch group 308 may be disconnected. After alternating current power that is input from the alternating current charging port 305 is transformed by using the transformer 304, the alternating current power is converted into direct current power by using the first switch group 307 and the two bridge arms of the three-phase bridge arm converter 302, to charge the battery 301. In addition, because the second switch group 308 is disconnected, a current on the three-phase bridge arm converter 302 does not affect the motor winding 303. When the alternating current charging port 305 is not connected to a charging pile but connected to an electric device, electric energy in the battery 301 may be converted into an alternating current by using the two bridge arms of the three-phase bridge arm converter 302, to charge/supply power to the device connected to the alternating current charging port 305. When the energy conversion apparatus is in a motor drive mode, the first switch group 307 may be disconnected, and the second switch group 308 may be connected. In this case, electric energy in the battery 301 may be transmitted to the motor winding 303 through the three-phase bridge arm converter 302 and the second switch group 308. Because the first switch group 307 is disconnected, electric energy that is input from the alternating current charging port cannot enter the three-phase bridge arm converter 302.

Figure 3B:
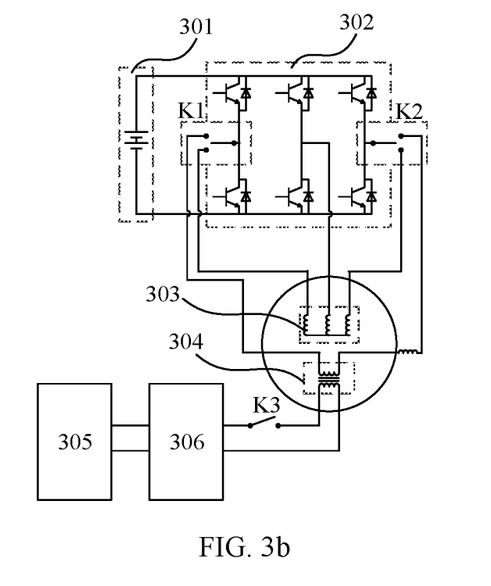
FIG. 3b is a schematic diagram of another energy conversion apparatus according to an embodiment of this application.

In some other embodiments, in the energy conversion apparatus, the first switch group 307 and the second switch group 308 may be replaced with a flip-flop K1 and a flip-flop K2, as shown in FIG. 3b. An alternating current port of a leftmost bridge arm of the three-phase bridge arm converter 302 is connected to one end of the flip-flop K1, and the other end of the flip-flop K1 has two contacts respectively connected to a leftmost winding of the motor winding 303 and the secondary-side winding of the transformer 304. An alternating current port of a rightmost bridge arm of the three-phase bridge arm converter 302 is connected to one end of the flip-flop K2, and the other end of the flip-flop K2 has two contacts respectively connected to a rightmost winding of the motor winding 303 and the secondary-side winding of the transformer 304. In FIG. 3b, when the energy conversion apparatus is in an alternating current charging mode, and the flip-flop K1 and the flip-flop K2 each are in contact with by using an upper contact, the alternating current ports of the left and right bridge arms of the three-phase bridge arm converter 302 are connected to the secondary-side winding of the transformer 304. After alternating current power that is input from the alternating current charging port 305 is transformed by using the transformer 304, the alternating current power is converted into direct current power by using the flip-flop K1, the flip-flop K2, and the three-phase bridge arm converter 302, to charge the battery 301. When the alternating current charging port 305 is not connected to a charging pile but connected to an electric device, electric energy in the battery 301 may be converted into an alternating current by using the two bridge arms of the three-phase bridge arm converter 302, to charge/supply power to the device connected to the alternating current charging port 305. In another case, when the energy conversion apparatus is in a motor drive mode, and the flip-flop K1 and the flip-flop K2 each are in contact with by using a lower contact, the alternating current ports of the left and right bridge arms of the three-phase bridge arm converter 302 are connected to the motor winding 303, and an alternating current port of a middle bridge arm of the three-phase bridge arm converter 302 is also connected to the motor winding 303. Therefore, electric energy that is output from the battery 301 can be transmitted to the motor winding 303 through the three-phase bridge arm converter 302, to drive a motor.

In the embodiment corresponding to FIG. 3a or FIG. 3b, the alternating current charging port 305 may further be specifically connected to the primary-side winding of the transformer 304 through an alternating current filter 306 and a flip-flop K3. The alternating current filter 306 and the flip-flop K3 are similar to the alternating current filter 107 and the switch 108 in the foregoing embodiments corresponding to FIG. 1, and details are not described herein again.

In this embodiment of this application, the flip-flop K1 and the flip-flop K2 each may be replaced with a single-pole double-throw switch, and the flip-flop K3 may also be replaced with another switch. This is not limited in this embodiment of this application.

Figure 4A:
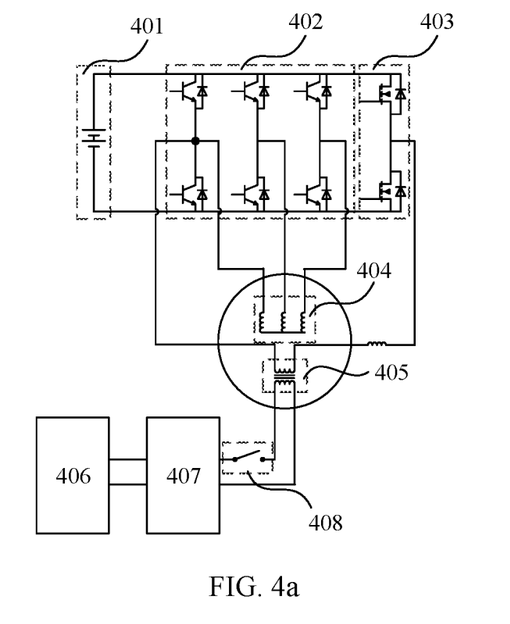
FIG. 4a is a schematic diagram of another energy conversion apparatus according to an embodiment of this application.

FIG. 4a is a schematic diagram of another energy conversion apparatus according to an embodiment of this application. The energy conversion apparatus includes a battery 401, a three-phase bridge arm converter 402, a bridge arm circuit 403, a motor winding 404, a transformer 405, and an alternating current charging port 406. The battery 401 is similar to the battery 101 in the foregoing embodiments corresponding to FIG. 1, and details are not described herein again. A connection between the three-phase bridge arm converter 402 and the motor winding 404 is similar to the connection between the three-phase bridge arm converter 102 and the motor winding 104 in the foregoing embodiments corresponding to FIG. 1. Details are not described herein again.

In this embodiment of this application, one bridge arm (which is a leftmost bridge arm in the example in FIG. 4a, or may be another bridge arm in actual application, where this is not limited in this embodiment of this application) of the three-phase bridge arm converter 402 is further connected to a secondary-side winding of the transformer 405.

Figure 4B:
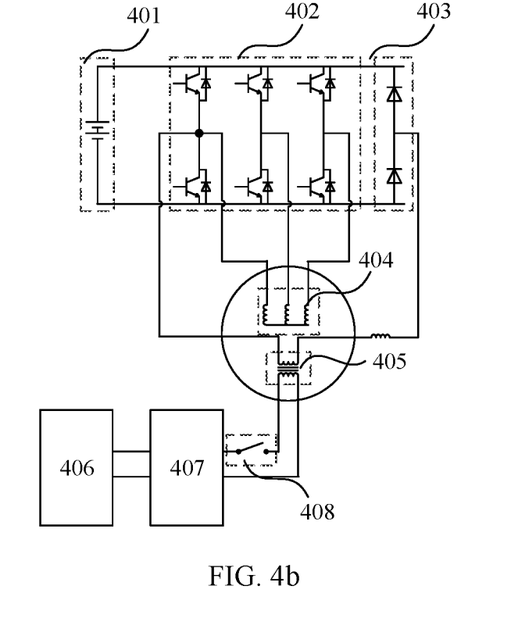
FIG. 4b is a schematic diagram of another energy conversion apparatus according to an embodiment of this application.

In this embodiment of this application, a direct current port of the bridge arm circuit 403 is connected to a direct current port of the three-phase bridge arm converter 402 in parallel, and an alternating current port of the bridge arm circuit 403 is connected to the secondary-side winding of the transformer 405. In some embodiments, the bridge arm circuit 403 includes two switching transistors connected in series. As shown in FIG. 4a, the bridge arm circuit 403 includes transistors. In actual application, the bridge arm circuit 403 may alternatively include diodes connected in series, as shown in FIG. 4b. Alternatively, the bridge arm circuit 403 may include capacitors connected in series, as shown in FIG. 4c.

The energy conversion apparatus provided in this embodiment of this application may implement an alternating current charging mode. To be specific, alternating current power that is input from the alternating current charging port 406 may be rectified by using one bridge arm of the three-phase bridge arm converter 402 and the bridge arm circuit 403, and direct current power is output to the battery 401, to charge the battery 401.

The energy conversion apparatus provided in this embodiment of this application may implement a motor drive mode. To be specific, the battery 401 outputs direct current power to the three-phase bridge arm converter 402, the direct current power is inverted into three-phase alternating current power, and the three-phase alternating current power is transmitted to the motor winding 404, to drive a motor.

Figure 4C:
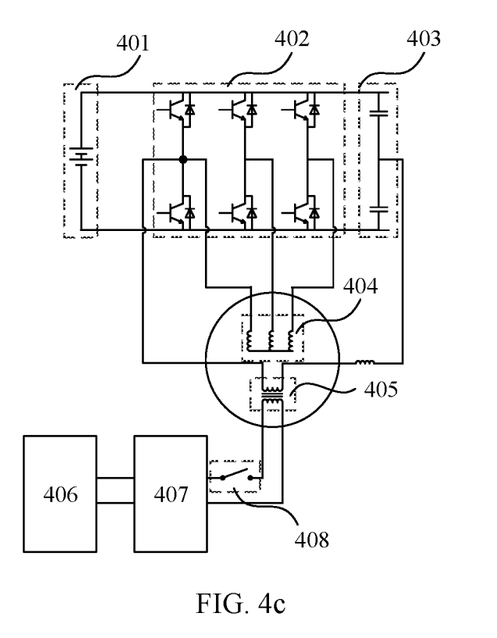
FIG. 4c is a schematic diagram of another energy conversion apparatus according to an embodiment of this application.

The energy conversion apparatus provided in embodiments corresponding to FIG. 4a and FIG. 4c may implement an inversion mode. To be specific, direct current power that is output from the battery 401 may be inverted by using one bridge arm of the three-phase bridge arm converter 402 and the bridge arm circuit 403, and output to the alternating current charging port 406, to charge/supply power to a device connected to the alternating current charging port 305.

In actual application, in embodiments corresponding to FIG. 4a, FIG. 4b, and FIG. 4c, an appropriate switch (such as a flip-flop or a relay) may be disposed in a related connection place to control switching between the foregoing modes. This is not limited in embodiments of this application.

In embodiments corresponding to FIG. 4a, FIG. 4b, and FIG. 4c, the alternating current charging port 406 may further be specifically connected to the transformer 405 through an alternating current filter 407 and a flip-flop 408. The alternating current filter 407 and the flip-flop 408 are similar to the alternating current filter 107 and the switch 108 in the foregoing embodiments corresponding to FIG. 1, and details are not described herein again.

Figure 5:
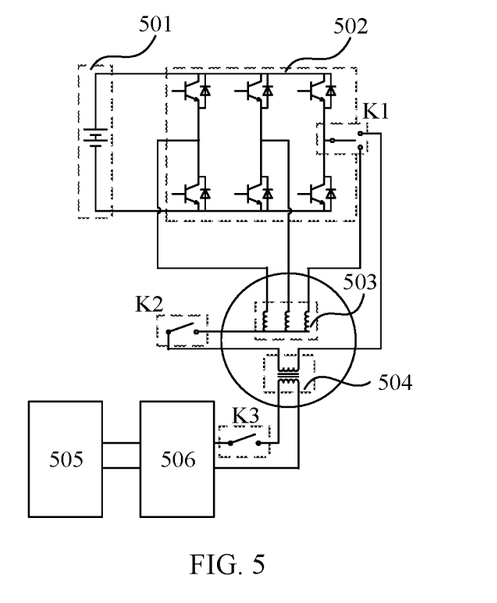
FIG. 5 is a schematic diagram of another energy conversion apparatus according to an embodiment of this application.

FIG. 5 is a schematic diagram of another energy conversion apparatus according to an embodiment of this application. The energy conversion apparatus includes a battery 501, a three-phase bridge arm converter 502, a motor winding 503, a transformer 504, and an alternating current charging port 505. The battery 501 is similar to the battery 101 in the foregoing embodiments corresponding to FIG. 1, and details are not described herein again. A connection between the three-phase bridge arm converter 502 and the motor winding 503 is similar to that in the related description in the foregoing embodiments corresponding to FIG. 1. Details are not described herein again.

In this embodiment of this application, a busbar end of the motor winding 503 is further connected to a secondary-side winding of the transformer 504 through a switch K2. In actual application, the switch K2 may be a flip-flop, a relay, or the like. This is not limited in this embodiment of this application. In addition, an alternating current port of a rightmost bridge arm of the three-phase bridge arm converter 502 is connected to the motor winding 503 and the secondary-side winding of the transformer 504 through a switch K1. Specifically, one end of the switch K1 is connected to the alternating current port of the rightmost bridge arm of the three-phase bridge arm converter 502, and the other end has two contacts respectively connected to the motor winding 503 and the secondary-side winding of the transformer 504. The switch K1 may be a flip-flop, a single-pole double-throw switch, or the like. This is not limited in this embodiment of this application.

The alternating current charging port 505 may further be specifically connected to a primary-side winding of the transformer 504 through an alternating current filter 506 and a flip-flop K3. The alternating current filter 506 and the flip-flop K3 are similar to the alternating current filter 107 and the switch 108 in the foregoing embodiments corresponding to FIG. 1, and details are not described herein again.

When the energy conversion apparatus shown in FIG. 5 runs in an alternating current charging mode, the switch K1 is connected to an upper contact, the switch K2 is closed, and the switch K3 is closed. In this case, alternating current power that is input from the alternating current charging port 505 may be transformed by using the transformer 504 and then rectified into direct current power by using the left bridge arm, the middle bridge arm, and the right bridge arm of the three-phase bridge arm converter 502, and the direct current power is delivered to the battery 501, to charge the battery 501. In this case, when the alternating current charging port 505 is not connected to a charging pile but connected to an electric device, electric energy in the battery 501 may be converted into an alternating current by using the three-phase bridge arm converter 502, to charge/supply power to the device connected to the alternating current charging port 505.

When the energy conversion apparatus shown in FIG. 5 runs in a motor drive mode, the switch K1 is connected to a lower contact, the switch K2 is disconnected, and the switch K3 is disconnected. In this case, electric energy that is output from the battery 501 is output to the motor winding 503 through the three-phase bridge arm converter 502, to drive a motor.

In this embodiment of this application, when a left winding and a middle winding of the motor winding 503 are in the alternating current charging mode, a function of an energy storage inductor (which may also be referred to as a power factor correction (PFC) inductor) can be implemented. In the motor drive mode, a winding of the motor winding 503 is used as a winding for driving a motor according to a conventional solution. Therefore, in this embodiment of this application, not only the bridge arm of the three-phase bridge arm converter 502 is reused, but also the winding of the motor winding 503 is reused. This further increases an integration level and reduces a volume of the energy conversion apparatus.

Figure 6:
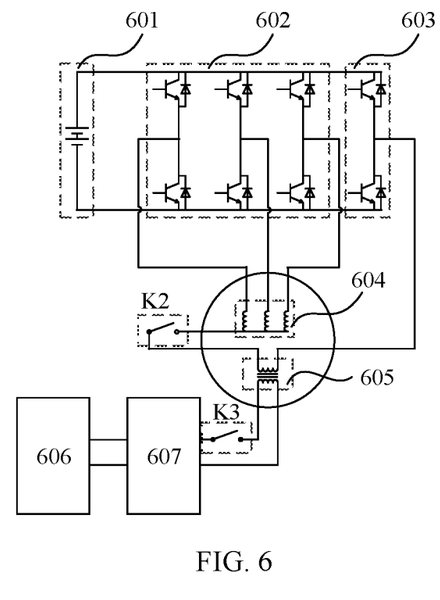
FIG. 6 is a schematic diagram of another energy conversion apparatus according to an embodiment of this application.

FIG. 6 is a schematic diagram of another energy conversion apparatus according to an embodiment of this application. The energy conversion apparatus includes a battery 601, a three-phase bridge arm converter 602, a bridge arm circuit 603, a motor winding 604, a transformer 605, and an alternating current charging port 606. The battery 601 is similar to the battery 101 in the foregoing embodiments corresponding to FIG. 1, and details are not described herein again. A connection between the three-phase bridge arm converter 602 and the motor winding 604 is similar to the connection between the three-phase bridge arm converter 102 and the motor winding 104 in the foregoing embodiments corresponding to FIG. 1. Details are not described herein again.

In this embodiment of this application, a direct current port of the bridge arm circuit 603 is connected to the battery 601, and an alternating current port of the bridge arm circuit 603 is connected to a secondary-side winding of the transformer 605. Specifically, one end of the secondary-side winding of the transformer 605 is connected to a busbar end of the motor winding 604 through a switch K2, and the other end of the secondary-side winding of the transformer 605 is connected to the alternating current port of the bridge arm circuit 603.

It may be understood that the bridge arm circuit 603 may include switching transistors, diodes, or capacitors that are connected in series. This is not limited in this embodiment of this application.

In this embodiment of this application, the alternating current charging port 606 may further be specifically connected to a primary-side winding of the transformer 504 through an alternating current filter 506 and a flip-flop K3. The alternating current filter 506 and the switch K3 are similar to the alternating current filter 107 and the switch 108 in the foregoing embodiments corresponding to FIG. 1, and details are not described herein again.

In this embodiment of this application, the switch K2 and the switch K3 each may be a flip-flop, a relay, or the like. This is not limited in this embodiment of this application.

When the energy conversion apparatus shown in FIG. 6 runs in an alternating current charging mode, the switch K2 and the switch K3 are closed. Alternating current power that is input from the alternating current charging port 606 is transformed (voltage-up or voltage-down) by using the transformer 605 and then rectified into direct current power by using three bridge arms of the three-phase bridge arm converter 602 and the bridge arm circuit 603, and the direct current power is delivered to the battery 601, to charge the battery 601. In this case, when the alternating current charging port 606 is not connected to a charging pile but connected to an electric device, electric energy in the battery 601 may be converted into an alternating current by using the three-phase bridge arm converter 602 and the bridge arm circuit 603, to charge/supply power to the device connected to the alternating current charging port 606.

When the energy conversion apparatus shown in FIG. 6 runs in a motor drive mode, the switch K2 and the switch K3 are disconnected. Direct current power that is output from the battery 601 is delivered to the motor winding 604 through the three-phase bridge arm converter 602, to drive a motor.

It may be understood that, when the energy conversion apparatus is in the alternating current charging mode, the energy conversion apparatus reuses the bridge arm of the three-phase bridge arm converter 602 and the winding of the motor winding 604. This increases an integration level and reduces a volume of the energy conversion apparatus.

An embodiment of this application further provides a motor. The motor includes a housing, and the energy conversion apparatus shown in FIG. 1, FIG. 3*a*, FIG. 3*b*, FIG. 4*a*, FIG. 4*b*, FIG. 4*c*, FIG. 5, or FIG. 6 is accommodated in the housing.

An embodiment of this application further provides a power system, including a motor and the energy conversion apparatus shown in FIG. 1, FIG. 3*a*, FIG. 3*b*, FIG. 4*a*, FIG. 4*b*, FIG. 4*c*, FIG. 5, or FIG. 6. A motor winding of the energy conversion apparatus is configured to drive the motor.

An embodiment of this application further provides a vehicle, including the energy conversion apparatus shown in FIG. 1, FIG. 3*a*, FIG. 3*b*, FIG. 4*a*, FIG. 4*b*, FIG. 4*c*, FIG. 5, or FIG. 6, or including the foregoing power system.

It may be clearly understood by a person skilled in the art that, for purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The foregoing embodiments are merely intended for describing the technical solutions of this application, but not for limiting this application. Although this application is described in detail with reference to the foregoing embodiments, a person of ordinary skill in the art should understand that modifications to the technical solutions recorded in the foregoing embodiments or equivalent replacements to some technical features thereof may still be made, without departing from the scope of the technical solutions of embodiments of this application.

What is claimed is:

1. An energy conversion apparatus comprising: a three-phase bridge arm converter, a motor winding, a two-phase two-bridge-arm converter, and a transformer, wherein
    a direct current port of the three-phase bridge arm converter is connected to a battery;
    an alternating current port of the three-phase bridge arm converter is connected to the motor winding;
    a direct current port of the two-phase two-bridge-arm converter is connected to the battery;
    an alternating current port of the two-phase two-bridge-arm converter is connected to a secondary-side winding of the transformer; and
    a primary-side winding of the transformer is connected to an alternating current charging port.

2. An energy conversion apparatus comprising: a three-phase bridge arm converter, a motor winding, and a transformer, wherein
    a direct current port of the three-phase bridge arm converter is connected to a battery;
    an alternating current port of the three-phase bridge arm converter is connected to the motor winding;
    two bridge arms of the three-phase bridge arm converter are connected to a secondary-side winding of the transformer through a first switch group, and the first switch group is configured to control connection and disconnection between the transformer and the two bridge arms of the three-phase bridge arm converter;
    a second switch group is further disposed between the motor winding and the two bridge arms of the three-phase bridge arm converter, and the second switch group is configured to control connection and disconnection between the motor winding and the two bridge arms of the three-phase bridge arm converter; and
    a primary-side winding of the transformer is connected to an alternating current charging port.

3. The energy conversion apparatus according to claim 2, wherein the first switch group and the second switch group comprise a flip-flop K1 and a flip-flop K2;
    one end of the flip-flop K1 is connected to an alternating current port of a first bridge arm of a two-phase two-bridge-arm converter, and the other end of the flip-flop K1 comprises two contacts respectively connected to the motor winding and a secondary-side winding of the transformer; and
    one end of the flip-flop K2 is connected to an alternating current port of a second bridge arm of the two-phase two-bridge-arm converter, and the other end of the flip-flop K2 comprises two contacts respectively connected to the motor winding and the secondary-side winding of the transformer.

4. The energy conversion apparatus according to claim 1, wherein a fourth switch is disposed between the primary-side winding of the transformer and the alternating current charging port, and is configured to control connection and disconnection between the primary-side winding of the transformer and the alternating current charging port.

5. The energy conversion apparatus according to claim 1, wherein an alternating current filter is disposed between the primary-side winding of the transformer and the alternating current charging port.

6. The energy conversion apparatus according to claim 1, wherein the transformer is a power frequency transformer.

7. A motor comprising: a housing, and an energy conversion apparatus which is accommodated in the housing, wherein the energy conversion apparatus comprises a three-phase bridge arm converter, a motor winding, a two-phase two-bridge-arm converter, and a transformer, wherein
    a direct current port of the three-phase bridge arm converter is connected to a battery;
    an alternating current port of the three-phase bridge arm converter is connected to the motor winding;
    a direct current port of the two-phase two-bridge-arm converter is connected to the battery;
    an alternating current port of the two-phase two-bridge-arm converter is connected to a secondary-side winding of the transformer; and
    a primary-side winding of the transformer is connected to an alternating current charging port.

8. The motor according to claim 7, wherein a fourth switch is disposed between the primary-side winding of the transformer and the alternating current charging port, and is configured to control connection and disconnection between the primary-side winding of the transformer and the alternating current charging port.

9. The motor according to claim 7, wherein an alternating current filter is disposed between the primary-side winding of the transformer and the alternating current charging port.

10. The motor according to claim 7, wherein the transformer is a power frequency transformer.

* * * * *